United States Patent [19]

Campbell et al.

[11] Patent Number: 4,524,719
[45] Date of Patent: Jun. 25, 1985

[54] SUBSTRATE LOADING MEANS FOR A CHEMICAL VAPOR DEPOSITION APPARATUS

[75] Inventors: Bryant A. Campbell; Dale R. DuBois, both of Los Gatos; Ralph F. Manriquez, Saratoga; Nicholas E. Miller, Cupertino, all of Calif.

[73] Assignee: Anicon, Inc., San Jose, Calif.

[21] Appl. No.: 529,415

[22] Filed: Sep. 6, 1983

[51] Int. Cl.³ ............................................. C23C 13/08
[52] U.S. Cl. ..................................... 118/719; 118/725; 118/729; 414/217; 414/589; 414/751; 414/744 R
[58] Field of Search ............... 118/719, 725, 724, 733, 118/715, 729, 728, 50.1; 414/217, 589, 751, 744 R; 901/17

[56] References Cited

U.S. PATENT DOCUMENTS 3,293,074  12/1966  Nickl ................................. 156/613 X
3,704,987  12/1972  Arndt et al. ....................... 118/725 X
3,749,383   7/1973  Voigt et al. ....................... 118/729 X
3,951,271   4/1976  Mette ................................. 901/17 X

FOREIGN PATENT DOCUMENTS 843028   6/1981  U.S.S.R. ............................. 118/715

Primary Examiner—John D. Smith
Assistant Examiner—Bernard F. Plantz
Attorney, Agent, or Firm—William B. Walker

[57] ABSTRACT

A controlled temperature deposition device comprising an inner reaction chamber having gas distribution means for introducing gas into inner chamber and removing gas therefrom and a vacuum chamber means surrounding the inner deposition chamber and spaced from the walls thereof for maintaining a medium vacuum therein. Associated with the deposition device is a substrate loading and unloading fork which transfers substrates such as wafer boats from outside the device to a position in the inner deposition chamber and removes them from the inner deposition chamber following deposition.

11 Claims, 15 Drawing Figures

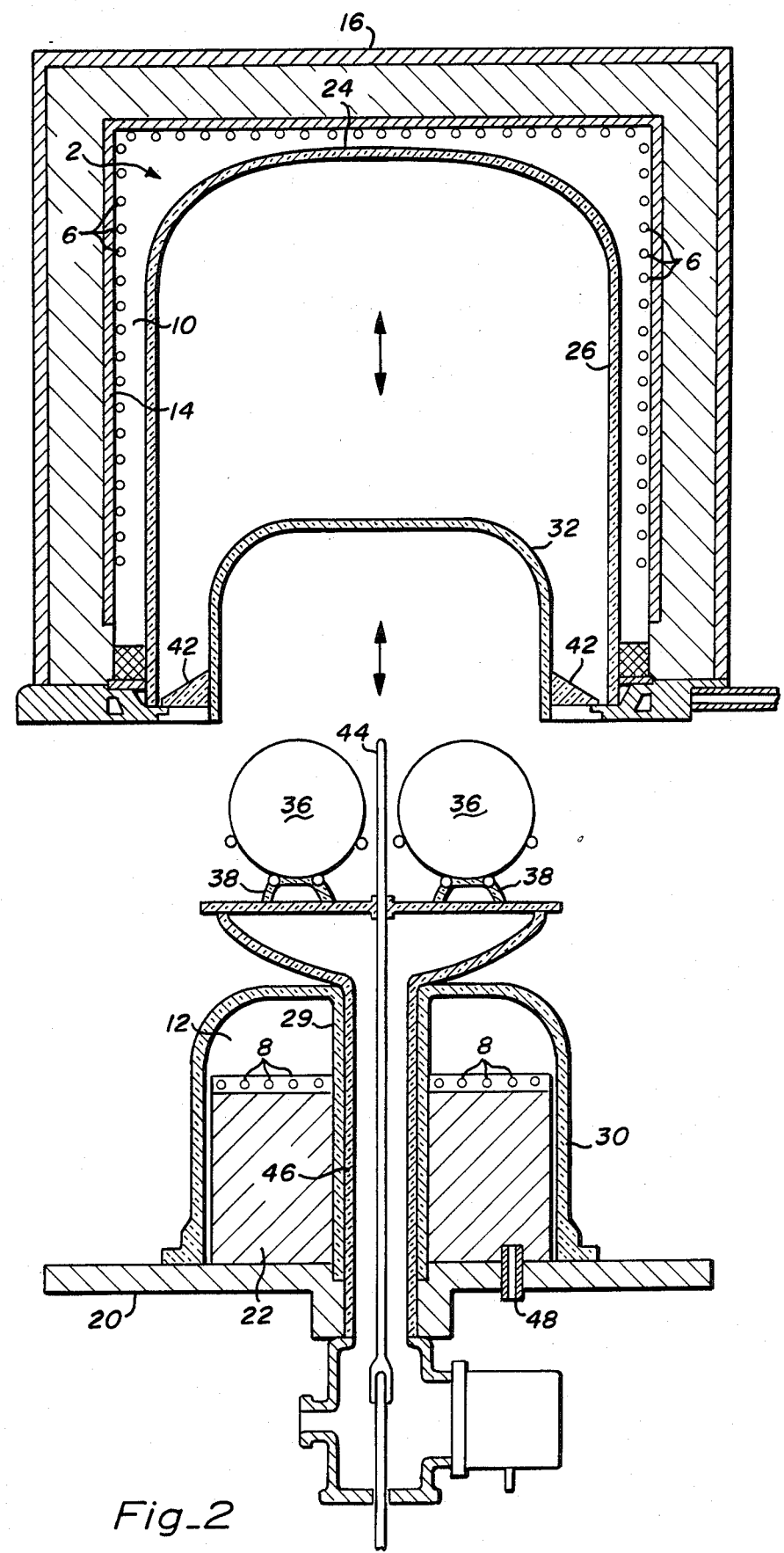
Fig_2

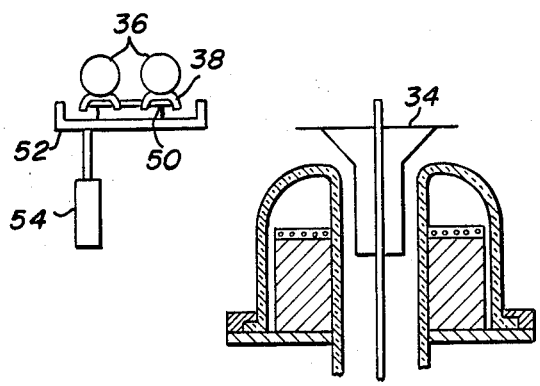
Fig_3
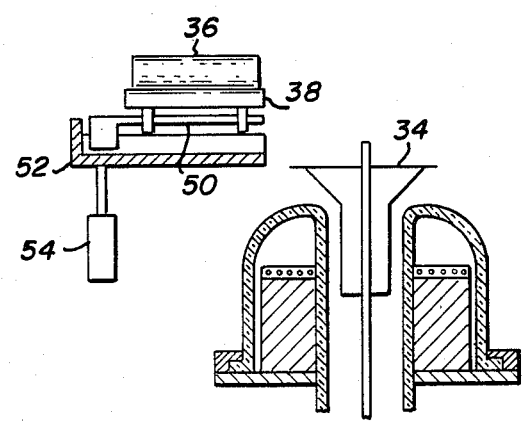
Fig_4
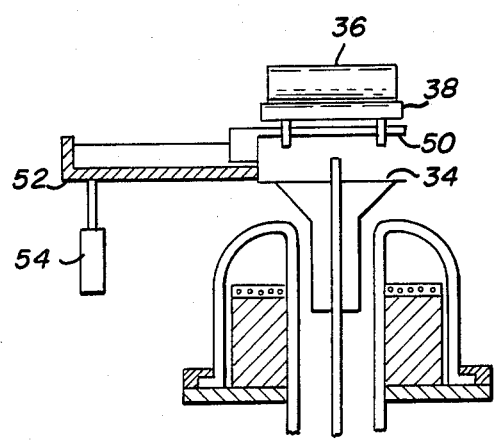
Fig_5
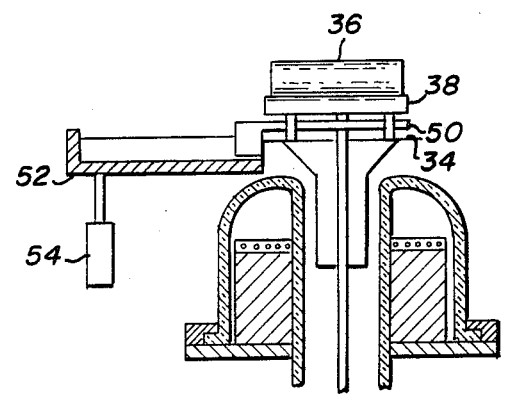
Fig_6

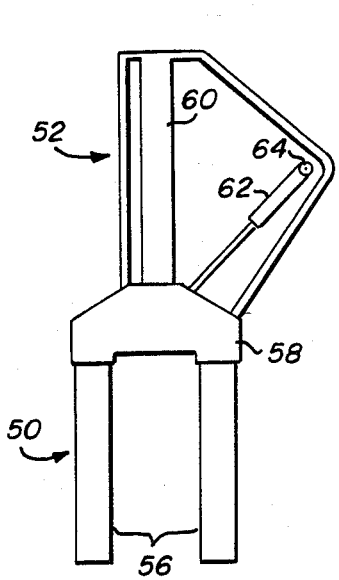
Fig_7
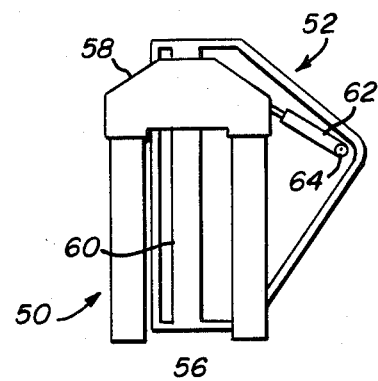
Fig_8
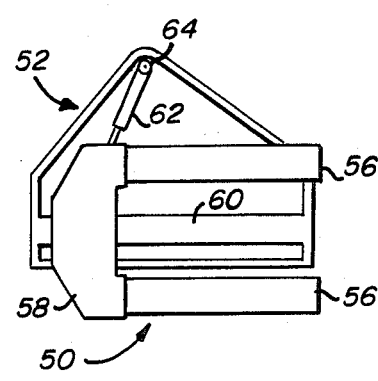
Fig_9
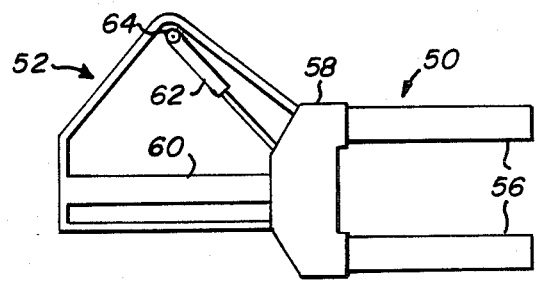
Fig_10
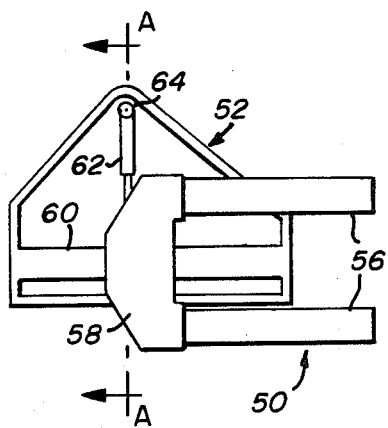
Fig_11
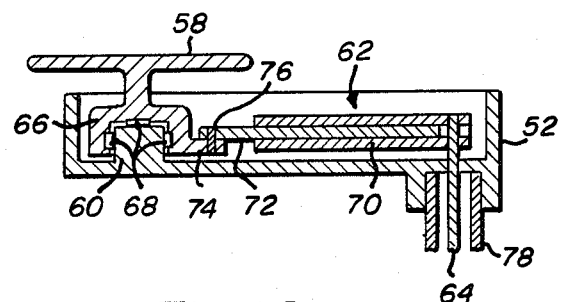
Fig_12

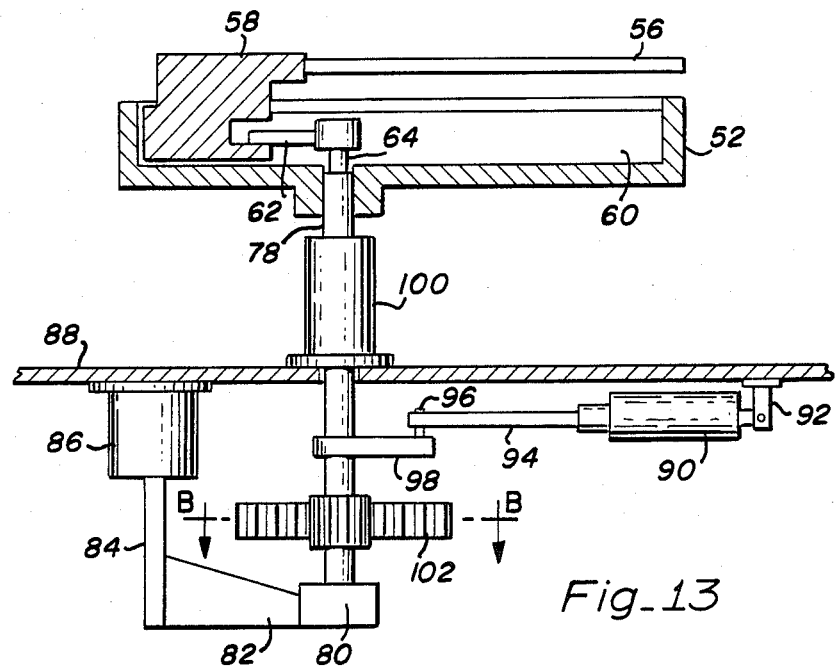
Fig_13
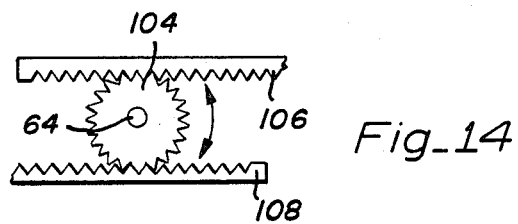
Fig_14
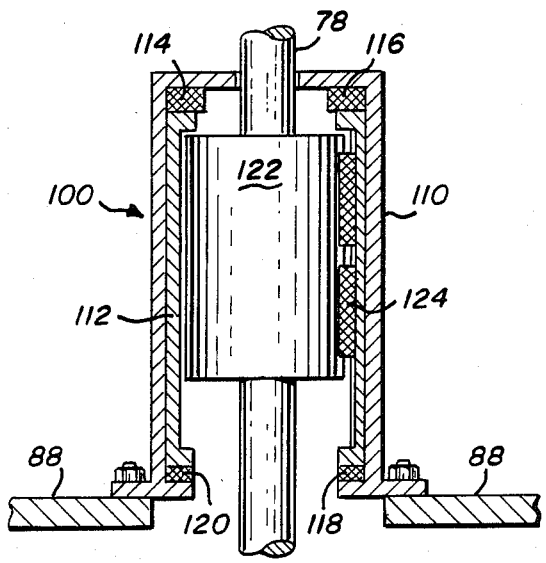
Fig_15

SUBSTRATE LOADING MEANS FOR A CHEMICAL VAPOR DEPOSITION APPARATUS

FIELD OF THE INVENTION

This invention relates to a chemical vapor deposition apparatus. In particular, this invention relates to an apparatus for the chemical vapor deposition of highly uniform, uncontaminated coatings of selected elements and compounds on substrates, and to components thereof.

BACKGROUND OF THE INVENTION

Chemical Vapor Deposition (CVD) is the process of depositing a solid material from a gaseous phase onto a substrate by means of a chemical reaction. The deposition reaction involved is generally thermal decomposition, chemical oxidation, or chemical reduction. In one example of thermal decomposition, organometallic compounds are transported to the substrate surface as a vapor and are reduced to the elemental metal state on the substrate surface.

For chemical reduction, the reducing agent most usually employed is hydrogen, although metal vapors can also be used. The substrate can also act as a reductant as in the case of tungsten hexafluoride reduction by silicon. The substrate can also supply one element of a compound or alloy deposit. The CVD process can be used to deposit many elements and alloys as well as compounds including oxides, nitrides and carbides.

In the present invention, CVD technology can be used to manufacture deposits on substrates for a variety of purposes. Tungsten carbide and aluminum oxide wear coatings on cutting tools; corrosion resistant coatings of tantalum, boron nitride, silicon carbide and the like and tungsten coatings on steel to reduce erosion can be applied according to this invention. The apparatus and method is particularly advantageous in manufacturing solid state electronic devices and energy conversion devices.

Chemical vapor deposition of electronic materials is described by T. L. Chu et al, *J. Bac. Sci. Technol.* 10, 1 (1973) and B. E. Watts, *Thin Solid Films* 18, 1 (1973). They describe the formation and doping of epitaxial films of such materials as silicon, germanium and GaAs, for example. In the field of energy conversion, the CVD process provides materials for nuclear fission product retention, solar energy collection, and superconduction. A summary of the chemical vapor deposition field is provided by W. A. Bryant, "The Fundamentals of Chemical Vapour Deposition" in *Journal of Materials Science* 12, 1285 (1977), and is hereby incorporated by reference.

The deposition parameters of temperature, pressure, the ratio of reactant gases, and amount and distribution of gas flow critically determine the deposition rates and the ability of a particular system to provide the desired uniformity and quality of deposition. The limitations of prior art systems stem from their inability to adequately control one or more of these factors or from deposit contamination.

DESCRIPTION OF THE PRIOR ART

The reaction chambers employed for chemical vapor deposition are generally classified as cold wall or as hot wall systems. In cold wall systems, the substrate is heated by inductive coupling, radiant heating or direct electrical resistance heating of internal support elements. Hot wall systems rely on radiant heating elements arranged to create a heated reaction and deposition zone. Conduction and convection heating approaches have also been used in hot wall systems.

Cold wall systems for chemical vapor deposition are described in U.S. Pat. Nos. 3,594,227, 3,699,298, 3,704,987, and 4,263,872. In these systems, the semiconductor wafers are positioned inside a vacuum chamber, and induction coils are arranged exterior to the vacuum chamber. The wafers are mounted on a susceptible material adapted for heating by RF energy. By localizing heat to the immediate semiconductor wafer area, chemical vapor deposition is limited to the heated areas. Since the unheated walls are below CVD temperatures, deposition on the walls is reduced. The temperatures in the reaction zone are usually not as uniform as those obtained with hot wall systems.

U.S. Pat. No. 3,705,567 is directed to a system for doping semiconductor wafers with a doping compound. The chamber containing the wafers extends into the oven in a cantilever supported system. Heating elements are provided along the sides, and the temperatures of the centrally located wafers would vary substantially from those at the ends. Diffusion of vapor is perpendicular to the wafer orientation, and the wafers are not exposed to uniform concentrations of doping compound. The edge to center, wafer to wafer, and batch to batch uniformity required for advanced semiconductor devices such as VLSI (very large scale integration) devices can not be achieved with this system. This is a closed, vapor deposition system and does not provide for positive gas flow using a carrier gas.

Hot wall CVD systems currently used in making semiconductor materials are most commonly converted doping ovens. These have long tubular reactors of quartz or similar inert material, and heat is provided by heating elements coiled around the outside of the cylindrical portion. The reactor ends are not heated, and temperature variance is so severe that only a portion in the center of the deposition chamber (typically one-third of the heated total) is useful. Equilibrium temperature variations between parts of the limited reaction zone typically exceeds 4° C. The tube walls become coated, are difficult to remove and clean, and are a source of debris. The wafers are positioned in a boat which is cantilevered from beyond the end of the tubular reactor, the wafers being reloaded by full retraction of the cantilevered support from the chamber. The floor area occupied by a single converted doping oven and associated equipment (for a 30 inch effective reaction zone) is about 70 to 80 sq. feet. These converted ovens have severe limitations for use in manufacturing advanced integrated circuit components, frequently contaminating the semiconductor wafers and causing a high rejection rate. Because of the configuration of these devices, the support surfaces are necessarily exposed to elevated temperatures and require interaction between lubricated wearing surfaces. The dust from the wearing surfaces and volatile components of the lubricants enter the deposition zone, contaminating the wafers to such an extent that they are not suitable for manufacturing advanced chips. Sustaining power requirements are excessive, and the unit capacity is limited by the lengthy time required to reach thermal equilibrium. Prior to this invention, apparatus has not been available to manufacture the precision, high quality coatings desired by the semiconductor industry for the most advanced integrated circuit components such as VLSI devices. This is a consequence of the increased requirements for the uniform and homogeneous physical and electrical properties such as dielectric strength, resistivity and the like.

SUMMARY AND OBJECTS OF THE INVENTION

The controlled temperature deposition device of this invention comprises an inner deposition chamber having gas distribution means for introducing gas into the inner chamber and removing gas therefrom and a vacuum chamber means surrounding the inner deposition reaction chamber and spaced from the walls thereof for maintaining a minimum vacuum therein. The vacuum chamber means comprises a domed housing and a base cooperating therewith, the material of the domed housing and base being substantially transparent to radiation. Radiant heating means are positioned over the outer surface of the domed housing and base surrounding the inner deposition chamber for providing precisely controlled temperatures in the reaction chamber.

Substrate loading means are positioned for placing uncoated substrates in the inner deposition chamber and for removing coated substrates from the inner deposition chamber. The substrate loading means includes a fork means supported on a fork support having guide means engaging the fork for guiding the fork movement in a linear path between an extended position and a retracted position. The fork support is mounted on a fork support positioning means for lifting and lowering the fork support and for rotating the fork support between a position aligned with a substrate support surface outside the inner deposition chamber and a substrate support surface in the inner deposition chamber. The operating members are positioned below the fork, protected from exposure to elevated temperatures. In this position, dust and gas generating surfaces can be easily isolated from the fork, wafer boats and inner deposition reaction chamber parts.

It is an object of this invention to provide a chemical vapor deposition system which provides a more uniform temperature in the inner deposition reaction chamber thereof. It is a further object of this invention to provide an efficient reaction chamber loading and unloading mechanism which does not contribute contaminating dust or vapors to the deposition zone, thereby substantially increasing the quality of the coated products.

BRIEF DESCRIPTION OF THE DRAWINGS

FIG. 2 is a cross-sectional view of the CVD device of this invention in the open position for loading and unloading substrates.

FIG. 3 is a schematic, cross-sectional representation of the CVD device and loader of this invention in the two positions aligned with the uncoated substrate loading zone.

FIG. 4 is a schematic, cross-sectional representation of the CVD device of this invention in retracted position aligned with the inner deposition reaction chamber.

FIG. 5 is a schematic, cross-sectional representation of the CVD device of this invention in the extended position, the elevated fork being extended to a position over the inner deposition reaction chamber.

FIG. 6 is a schematic, cross-sectional representation of the CVD device of this invention in the extended position with the fork lowered and with substrates placed on a support in the inner deposition reaction chamber.

FIG. 7 is a top view of the fork and fork support in the extended position corresponding to FIG. 3.

FIG. 8 is a top view of the fork and fork support in the retracted position corresponding to FIG. 3.

FIG. 9 is a top view of the fork and fork support in the retracted position after rotation to the position shown in FIG. 4.

FIG. 10 is a top view of the fork and fork support of this invention in the extended position corresponding to FIGS. 5 and 6.

FIG. 11 is a top view of the fork and fork support in an intermediate position between extension and retraction.

FIG. 12 is a cross-sectional view taken along the line A—A in FIG. 11.

FIG. 13 is a schematic, cross-sectional side view representation of the fork and fork support assembly of this invention.

FIG. 14 is a partial cross-sectional view of the rotary actuator assembly taken along the line B—B in FIG. 13.

FIG. 15 is a cross-sectional representation of the support bearing assembly of the device of this invention.

DETAILED DESCRIPTION OF THE INVENTION

Figure 1:
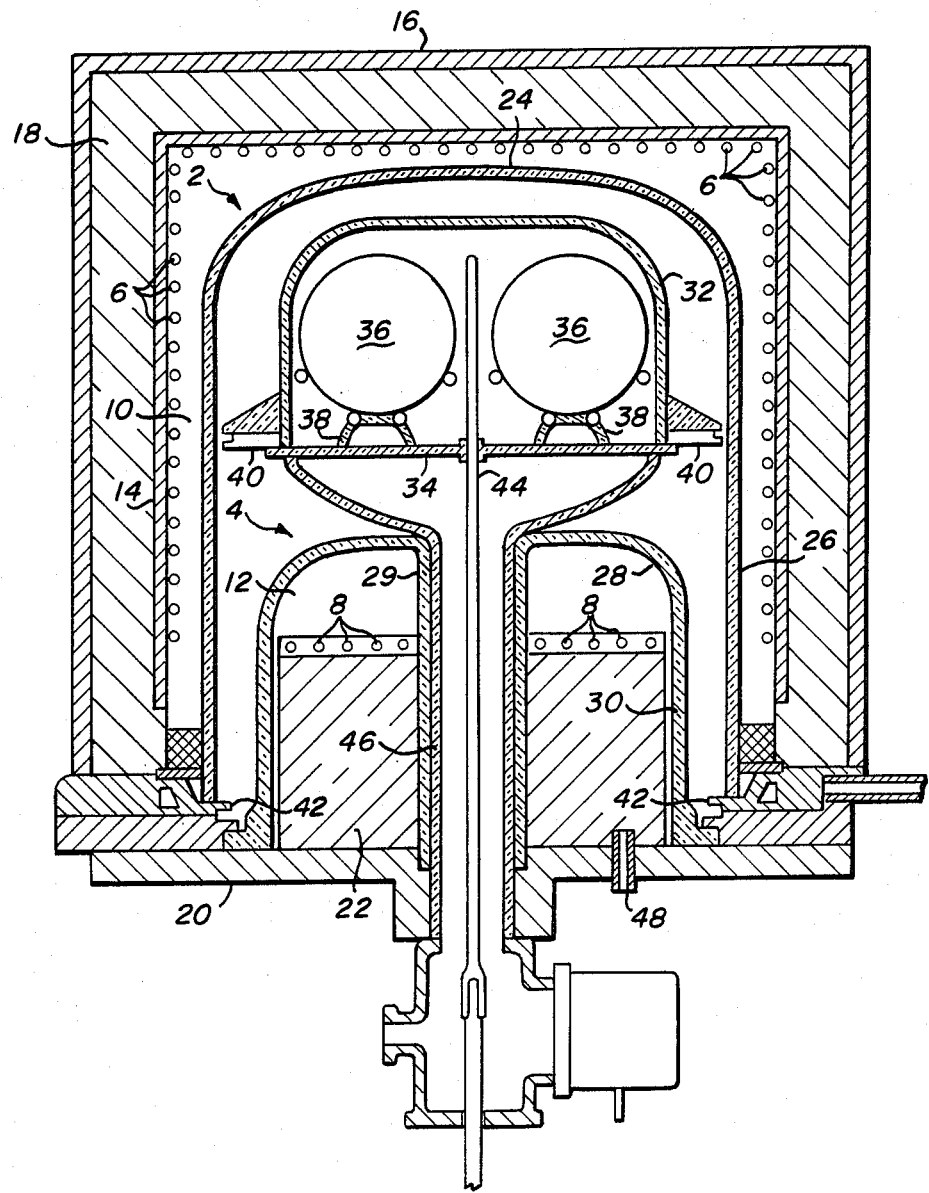
FIG. 1 is a cross-sectional view of the CVD device of this invention in the closed position.

The terms "chemical vapor deposition" and "CVD", as used herein, are defined to include modifications of the process which increase or change the reactivity, chemical properties or chemical composition of the reactant gases while retaining the basic characteristics of chemical vapor deposition processes. Thus, processes such as plasma assisted chemical vapor deposition, uv excited (ultraviolet light excited) chemical vapor deposition, microwave excited chemical vapor deposition and the like in which reactant gas molecules are converted to more reactive entities are included within the meaning of these terms as used herein.

The term "radiant heat source(s)", as used herein, includes any device, system or means for heating whereby at least a part of the heat is transferred by radiation. It is recognized and intended that heat transfer by conduction and convection will also occur. The "radiant heat source" can be any material having an elevated temperature, without limitations as to how the temperature elevation was affected. Resistance heating elements and coatings, heat lamps, heated liquids and solutions, and microwave or induction heated materials can function as "radiant heat sources", for example.

Referring to FIG. 1, a cross-sectional view of the chemical vapor deposition device of this invention is shown. The environment for the chemical vapor deposition is controlled within a zone defined by the domed housing 2 and domed base 4. These are constructed from a composition which is substantially transparent to radiant heat. Resistance heating elements 6 and 8 are illustrated. The radiant heat passing through the walls of the domed housing 2 and domed base 4 heating the chemical vapor deposition zone defined by these components. The resistance heating elements 6 and 8 are separated from the respective domed housing wall 2 and dome base 4 by an air space 10 and 12, respectively. By avoiding conductive heat transfer from the heating elements 6 and 8 to the walls of the domed housing 2 and domed base 4, the heat load thereon is reduced and as is described in greater detail hereinafter, thermal damage to heat sensitive sealing components is prevented.

The resistance heating elements 6 are supported on the inner housing wall 14 which is separated from the outer housing shell 16 by insulation 18. The resistance heating element 8 is separated from the support base 20 by insulation 22.

The term "dome" as used herein with respect to the housing 2 and base 4 can have a variety of configurations. For example, the top 24 of the domed housing 2 can be hemispherical. Preferably, the top has a flattened configuration, that is, has a spherical radius which is greater than the radius of the cylindrical sidewall 26. In a similar manner, the top 28 of the dome base 4 can have a flattened configuration, the radius of curvature thereof in a vertical plane through the central axis being greater than the radius of the base of the sidewall 30. The upper end of the axially concentric inner cylinder 29 of the domed base 4 flares outwardly to become the upper portion 28 integral therewith. The inner deposition reaction chamber is defined by the upper reaction chamber wall 32 and support plate or rods 34. The plate 34 also supports substrates such as wafers 36 held in a vertical plane by the boats 38. The domed reaction chamber wall 32 has outwardly extending projections 40 which are engaged by projections 42 when the outer housing components are lifted to expose the inner deposition chamber. The gas supply conduit 44 extends from the inner deposition reaction chamber defined by the domed reaction chamber housing 32 through the support plate 34 and down the center of the gas collector 46. Conduit 48 passing through the support base 20 can be used to reduce gas pressure in the interior of the domed base 4.

FIG. 2 is a cross-sectional view of the CVD device of this invention in the open position for insertion or removal of wafers. In this position, the upper housing 16 has been raised. The projections 40, having engaged the projections 42, have raised the upper reaction chamber wall 32 and exposed the inner vapor deposition zone. In this position, substrates such as the wafers 36 supported on boats 38 can be easily placed onto support 34 or removed therefrom.

Referring to FIGS. 3, 4, 5 and 6, cross-sectional representations of the loading and unloading device of this invention are shown illustrating the operation of the device in a succession of stages. In the position shown in FIG. 3, substrates such as boats 38 carrying a plurality of wafers 36 are positioned on fork 50. The substrate can be placed directly on fork 50 or be lifted from a support surface thereby. The fork 50 is supported on the fork support 52. The system for changing the elevation of the fork support 52 and orienting it is represented schematically by positioning means 54. In FIG. 4, the fork support 52 has been rotated, aligning the fork 50 with the support surface 34 of the inner deposition reaction chamber. In FIG. 5, the fork 50 has been translated to the extended position. In this position the boats 38 are positioned immediately above the support surface 34. In FIG. 6, the fork support 52 has been lowered to the lowest position, and the boats 38 have been placed upon the support surface 34 preparatory to the vapor deposition process. Following retraction of the forks 50 from the position shown in FIG. 6 and rotation to a position aligned with the uncoated substrate loading zone, the CVD apparatus is closed to the position in FIG. 1, and the deposition process is initiated.

As can be seen from the schematic representations in FIGS. 3-6, the substrate loading and unloading apparatus is compactly arranged, and the activating mechanisms are placed below and remote from the deposition zone.

FIGS. 7-11 are top views of the fork and fork support mechanism of this invention illustrating the operational positions thereof.

The fork 50 includes quartz covered loading projections 56 extending from plate 58. The plate 58 is supported track 60 of the fork support 52. It traverses the track 60 from the extended positions shown in FIGS. 7 and 10 to the retracted positions shown in FIGS. 8 and 9. The plate 58 is moved along the track 60 by the telescoping linkage 62 attached to the fork positioning shaft 64. The shaft 64 is positioned perpendicular to the axis of the guide track 60 and to the side of the guide track. Preferably the shaft 64 is positioned between imaginary lines which are perpendicular to the guide track 60 and which extend from the opposite ends thereof. Clockwise rotation of the shaft 64 in the positions shown in FIGS. 7 and 10 causes the plate 58 to move along the track 60 to the retracted position shown in FIGS. 8 and 9. Counterclockwise rotation of the shaft 64 causes a reverse motion of the plate 58 along the track 60 returning the fork 50 to the extended position shown in FIG. 10. FIG. 7 corresponds to FIG. 3 and shows the fork 50 in the extended position for engaging and lifting wafer boats and for depositing wafer boats on a surface. After uncoated wafer boats are positioned on the loading projections 56, for example, the fork 50 is retracted from the position shown in FIG. 7 to the fully retracted position shown in FIG. 8. Rotation of the fork support 52 aligns the fork 50 and the guide track 60 with the inner deposition reaction chamber support surface in the position shown in FIG. 9. Counterclockwise rotation of the shaft 64 causes the fork 50 to move to the extended position corresponding to FIGS. 5 and 6 whereby the boats are placed in the inner deposition chamber.

FIG. 11 is a top view of the fork and fork support assembly of this invention in an intermediate position, and FIG. 12 is a cross-sectional representation of the fork and fork assembly taken along the line A—A in FIG. 11. Referring to FIG. 12, the plate 58 has lower guide projections 66 which straddle the guide 60, the top and lateral surfaces thereof housing roller bearings 68 which prevent dust creating rubbing contact between the guide and guide projection surfaces. The bearing 68 are preferably recirculating roller bearings having an integral, low friction surface which avoids the use of particulate or liquid lubricants. The telescoping linkage 62 extends from the fork positioning shaft 64. It comprises an outer cylinder 70 and an inner shaft 72 axially concentric therewith. The end of the shaft 72 opposite the fork positioning shaft 64 is pivotly mounted on the flange 74 by pin 76. Preferably the pin 76 is surrounded by a bearing (not shown) preventing rubbing of the moving surfaces. The fork positioning shaft 64 is concentrically positioned in an outer shaft 78 upon which the fork support 52 is mounted.

Referring to FIG. 13, a schematic representation of a side sectional view of the loading assembly of this invention is shown. The tray support 52 is mounted on and supported by the outer shaft 78 which encloses the axially concentric fork positioning shaft 64. The outer shaft 78 is vertically aligned and pivotly mounted together with the fork positioning shaft 64 on bearing assembly 80 and plate 82. Plate 82 is supported by the shaft 84 of the double acting actuator and lift means 86 which is attached to the support plate 88. Movement of the shaft 84 upwardly lifts the plate 82 and the full assembly mounted thereon including the forks 56. When the shaft 84 is lowered, the full assembly including the fork 56 is lowered. One end of the double acting actuator 90 is pivotly attached to plate 88 by the connecting linkage 92. The actuator shaft 94 is mounted with a suitable bearing (not shown) to pin 96 attached to bell crank 98. Extension of the actuator 94 causes rotation of the shaft 78 and the fork support 52 supported thereby from the position shown in FIG. 9 to the position shown in FIG. 8. Retraction of the actuator 94 effects corresponding counterclockwise motion from the position shown in FIG. 8 to the position shown in FIG. 9. Major support for the fork operating assembly is provided by bearing system 100.

The rotary actuator 102 is a dual cylinder rotary actuator. FIG. 14 is a view taken along the line B—B in FIG. 13 and showing a schematic partial cross-sectional view of the rotary actuator. The spur gear 104 is attached to the fork positioning shaft 64. Racks 106 and 108 move in opposite directions, engaging teeth on opposite sides of spur gear 104 and effecting rotation of the shaft 64. Movement of the rack 108 from left to right, for example, causes counterclockwise rotation of the shaft 64. This effects movement of the fork 50 from the retracted shown in FIG. 9 to the fully extended position shown in FIG. 10.

FIG. 15 is a cross-sectional representation of the support bearing assembly 100 of the device of this invention. The outer housing 110, mounted on support plate 88, houses the major bearing components. Intermediate cylinder 112 is mounted for rotation about the vertical axis, supported by bearings 114, 116, 118 and 120. Inner cylinder 122 is mounted for movement up and down in the axial direction (vertical axis) within intermediate cylinder 112. The bearings 124 rest in vertically aligned races defined by opposed groves in the opposed walls of the inner cylinder 122 and the intermediate cylinder 112. The bearings 124 thus function to facilitate axial movement of the inner cylinder 122 up and down within the intermediate cylinder 112 but prevent rotation of the inner cylinder 122 about the vertical axis within the intermediate cylinder 112. The inner and intermediate cylinders rotate about the vertical axis as a single unit.

The wafer loading assembly of this invention is compact and minimizes the floor space required for the device, in sharp contrast to the cantilevered loading assembly used with previously known hot wall CVD systems. The dust creating sliding surfaces required with the cantilevered devices are eliminated. All moving parts are positioned outside the deposition zone, well below the fork, and in a position isolating them from the deposition zone. Dust and vapor contamination of wafers by the loading system is this eliminated.

The invention claimed is:

1. A controlled temperature deposition device comprising an inner deposition reaction chamber having gas distribution means for introducing gas into the inner chamber and removing gas therefrom, and vacuum chamber means surrounding the inner deposition reaction chamber and spaced from the walls thereof for maintaining a medium vacuum therein, the vacuum chamber means comprising a domed housing and a base cooperating therewith, the material of the domed housing and base being substantially transparent to radiation, said radiant heating means being positioned over outer surfaces of the domed housing and base surrounding the inner deposition chamber for providing precisely controlled temperatures in the reaction chamber, substrate loading means in combination with the device and positioned for placing a boat carrying a plurality of wafers in the inner deposition chamber and for removing the boat from the inner deposition chamber, the substrate loading means including a boat engaging means and a support for engaging the boat engaging means and for guiding the movement of the boat engaging means in a linear path between an extended position and a retracted position.

2. A controlled temperature deposition device comprising an inner deposition reaction chamber having gas distribution means for introducing gas into the inner chamber and removing gas therefrom, and vacuum chamber means surrounding the inner deposition reaction chamber and spaced from the walls thereof for maintaining a medium vacuum therein, the vacuum chamber means comprising a domed housing and a base cooperating therewith, the material of the domed housing and base being substantially transparent to radiation, said radiant heating means being positioned over outer surfaces of the domed housing and base surrounding the inner deposition chamber for providing precisely controlled temperatures in the reaction chamber, substrate loading means in combination with the device and positioned for placing a substrate in the inner deposition chamber and for removing a substrate from the inner deposition chamber, wherein the substrate loading means includes a fork means for removing an uncoated substrate from a loading zone outside the inner deposition chamber and placing the substrate in the inner deposition chamber, and for removing a coated substrate from the inner deposition chamber and moving it to the loading zone.

3. The controlled temperature deposition device of claim 2 wherein the fork means includes a fork having a substrate engaging means and a fork support thereunder having guide means engaging the fork for guiding the fork movement in a linear path between an extended position and a retracted position.

4. The controlled temperature deposition device of claim 3 wherein the fork support is operatively connected to a fork support positioning means for lifting and lowering the fork support and for rotating the fork support between a position aligned with the loading zone and a position aligned with the inner deposition chamber.

5. The controlled temperature deposition device of claim 4 wherein the fork support positioning means is a fork support outer shaft positioned axially concentric with the fork positioning shaft means and having a bell crank mounted thereon and connected to a double acting linear actuator means for rotating the fork support between the position aligned with the loading zone and a position aligned with the inner deposition chamber.

6. The controlled temperature deposition device of claim 3 wherein the fork is operatively connected by a telescoping linkage with a fork positioning shaft means mounted perpendicular to the axis of the guide means and positioned to the side thereof.

7. The controlled temperature deposition device of claim 6 wherein the fork positioning shaft means is operatively connected to a dual cylindar rotary actuator means for rotating the fork positioning shaft means between a first retracted fork position and a second extended fork position.

8. The controlled temperature deposition device of claim 6 wherein the fork support is mounted on a fork support positioning means for lifting and lowering the fork support and for rotating the fork support between a position aligned with the first support surface and a position aligned with the second support surface.

9. The controlled temperature deposition device of claim 8 wherein the fork support positioning means is an outer fork support outer shaft positioned axially concentric to the fork positioning shaft means and having a bell crank mounted thereon and connected to a double acting linear actuator means for rotating the fork support between the position aligned with the loading zone and a position aligned with the inner deposition chamber.

10. The controlled temperature deposition device of claim 9 wherein the lower end of the fork positioning shaft means and the fork support positioning shaft are rotatably mounted on a support plate means for lifting and lowering both of said shaft means.

11. The controlled temperature deposition device of claim 10 wherein the support plate means is connected to a vertically aligned double acting linear actuating means for lifting and lowering the support plate means and thereby lifting and lowering the fork support plate and the fork supported thereon.

* * * * *